United States Patent [19]

Anderson

[11] 4,020,289

[45] Apr. 26, 1977

[54] RANDOM ACCESS, MULTIPLE STATION COMMUNICATION SYSTEM

[75] Inventor: Scott K. Anderson, Orem, Utah

[73] Assignee: Teleplex, Inc., Orem, Utah

[22] Filed: Aug. 4, 1975

[21] Appl. No.: 601,363

Related U.S. Application Data

[63] Continuation of Ser. No. 253,265, May 15, 1972, abandoned.

[52] U.S. Cl. .......................... 179/15 FD; 179/2.5 R
[51] Int. Cl.² .............................................. H04J 1/06
[58] Field of Search ....... 179/15 FD, 15 AL, 2.5 R, 179/15 BM, 15 BL, 15 BY

[56] References Cited

UNITED STATES PATENTS

| 2,584,259 | 2/1952 | Crane | 179/15 FD |
|---|---|---|---|
| 3,261,922 | 7/1966 | Edson | 179/15 BM |
| 3,573,379 | 4/1971 | Schmitz | 179/2.5 R |
| 3,718,767 | 2/1973 | Ellis | 179/15 BM |
| 3,809,815 | 5/1974 | Reed | 179/15 FD |
| 3,864,521 | 2/1975 | DeLong | 179/2.5 R |

Primary Examiner—Kathleen H. Claffy
Assistant Examiner—Joseph A. Popek
Attorney, Agent, or Firm—Trask & Britt

[57] ABSTRACT

A plurality of communication stations is interconnected by conductors. Each station includes a transmitter and a receiver as well as control means. The transmitters transmit on any of several frequency bands, each such band being assigned to the receiver of a remote station. A signal generator interconnects the stations and generates intervalled pulse trains upon which the control means of the stations operate to impress coded control pulses. The stations include novel phase locking and phase detecting circuits.

5 Claims, 21 Drawing Figures

FIG. 3

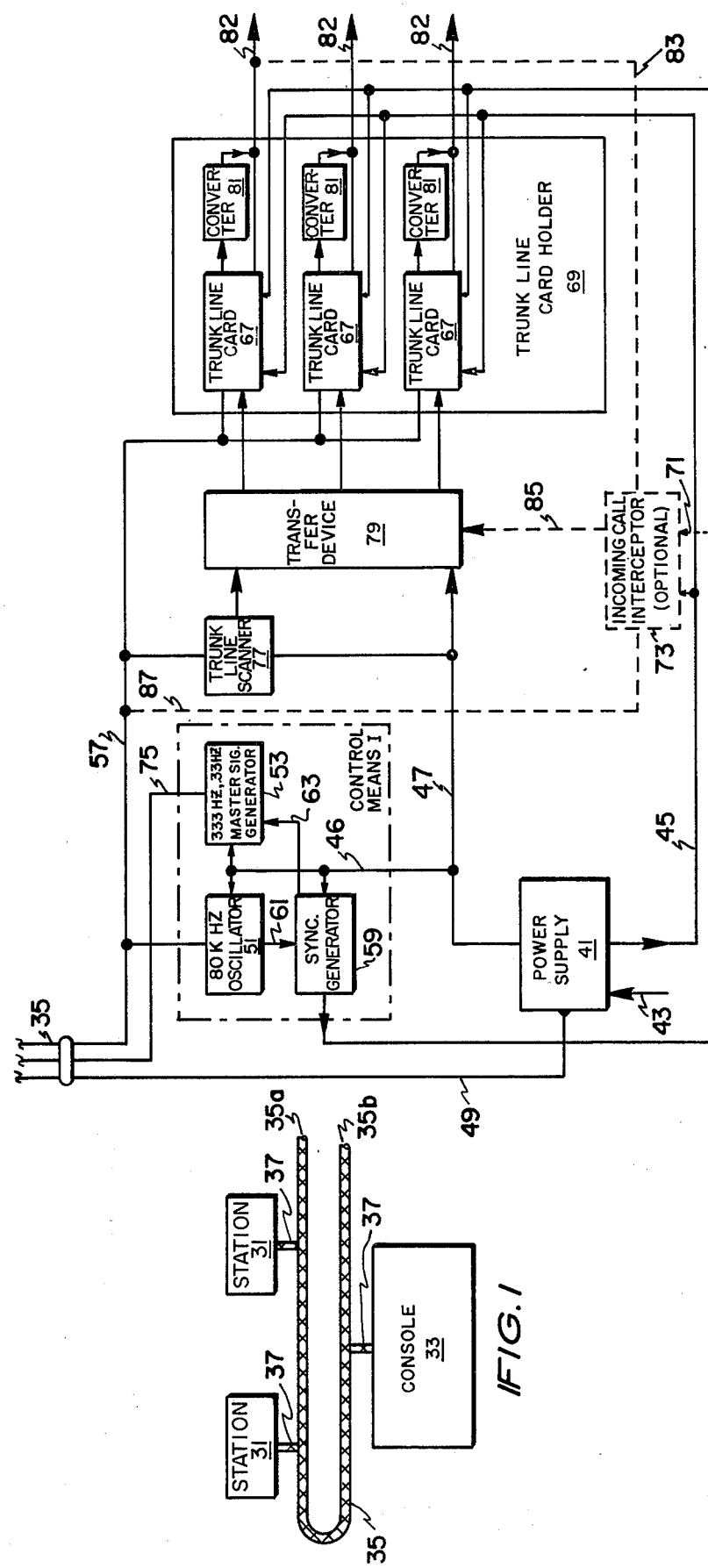

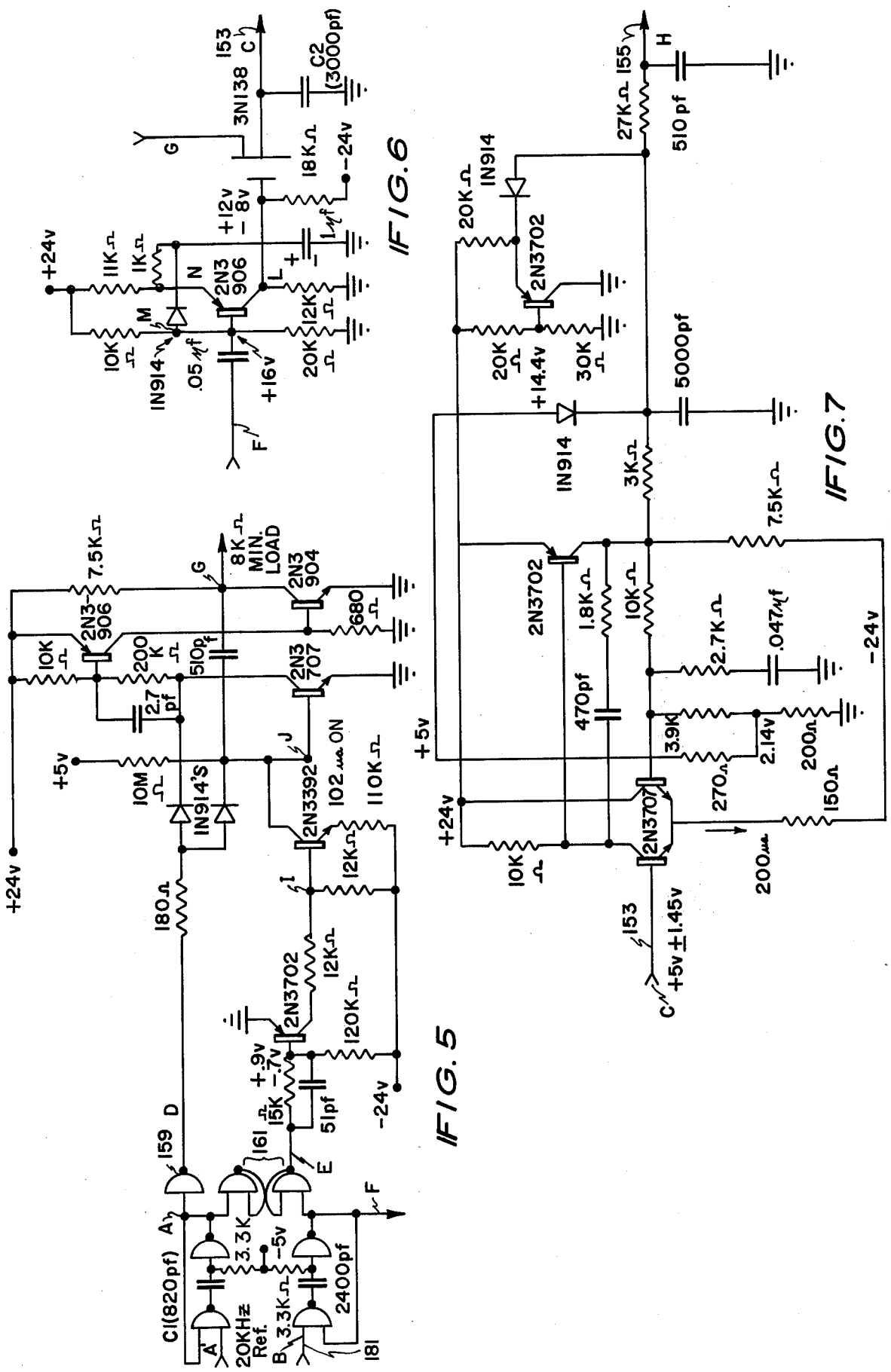

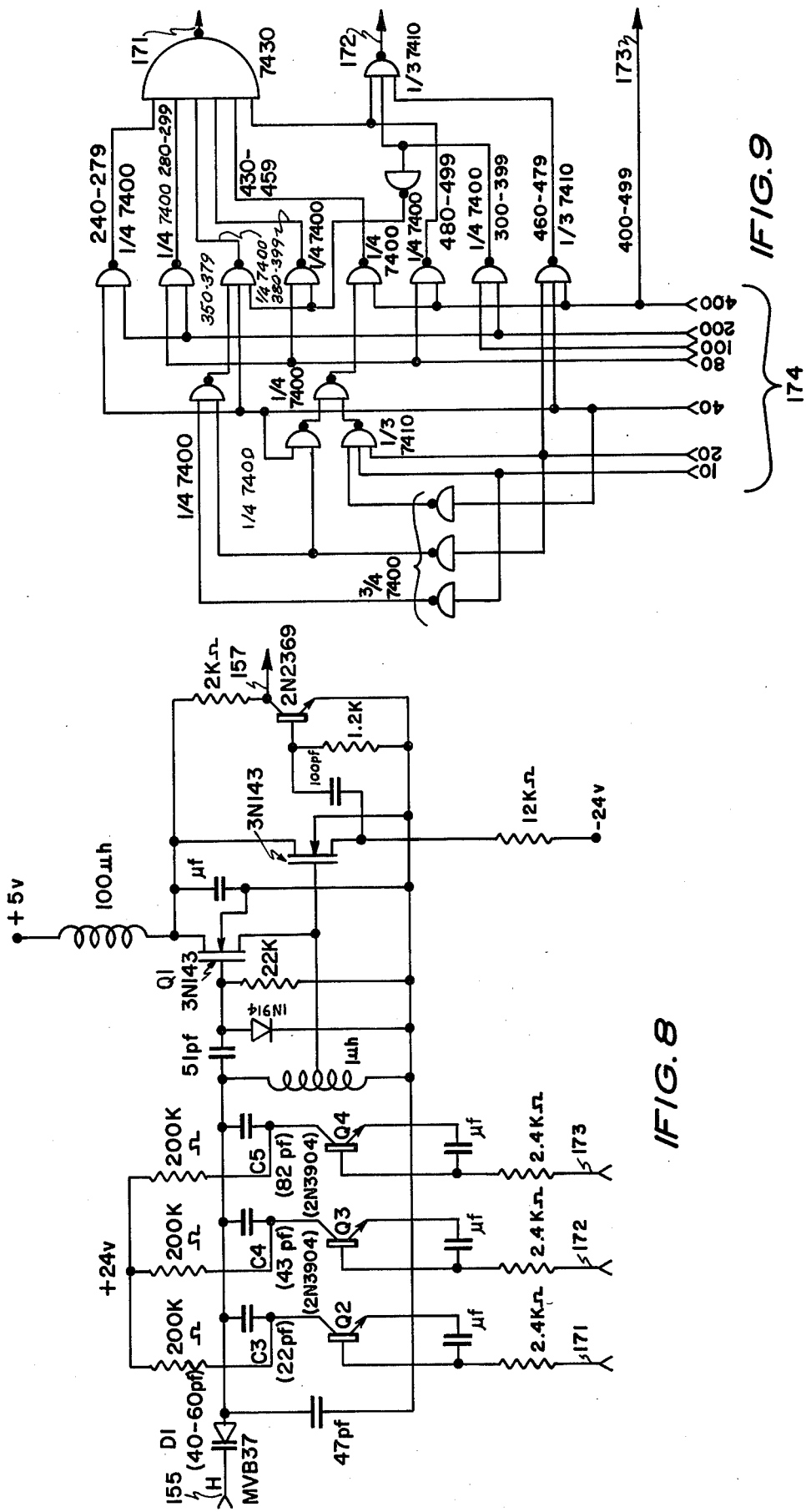

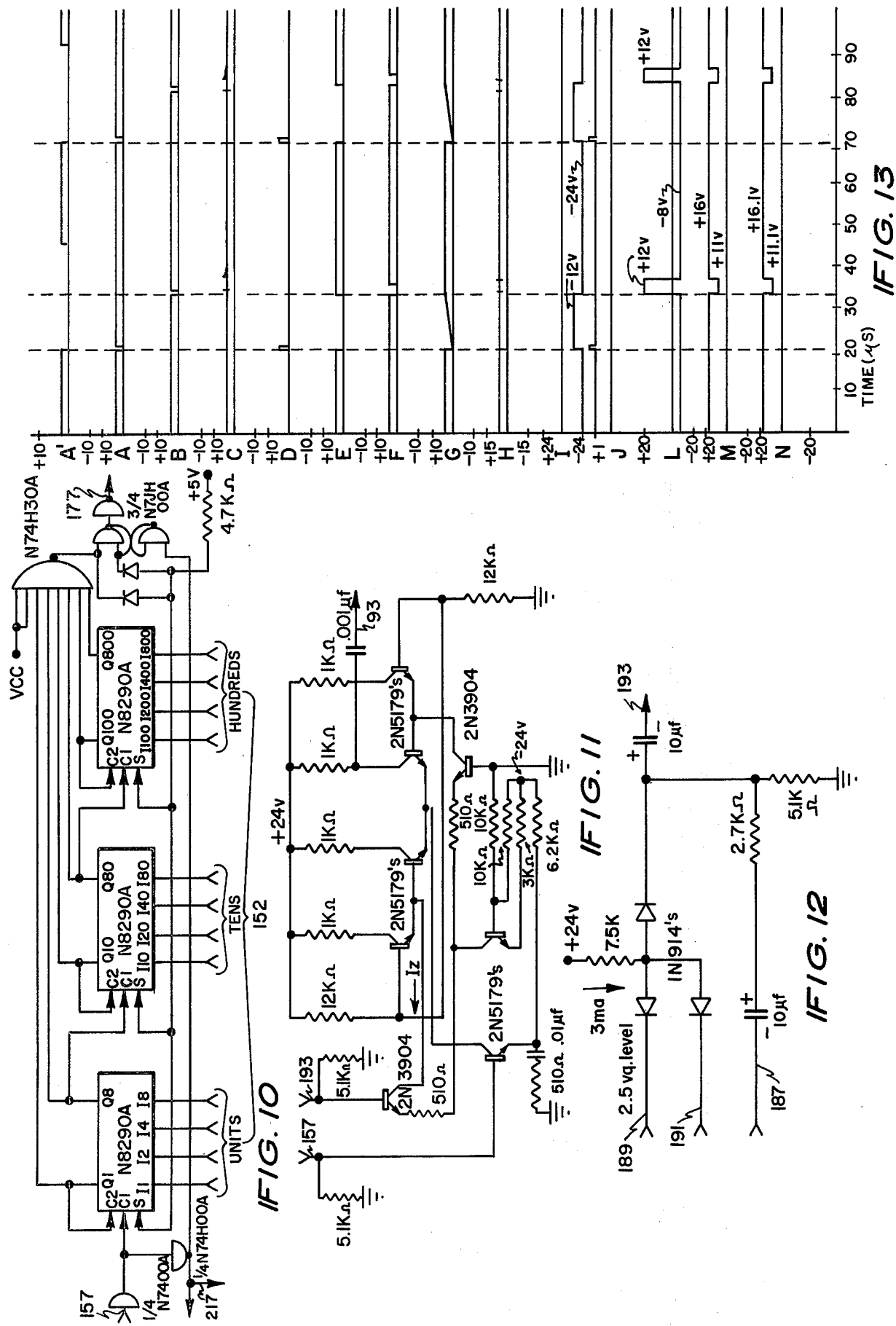

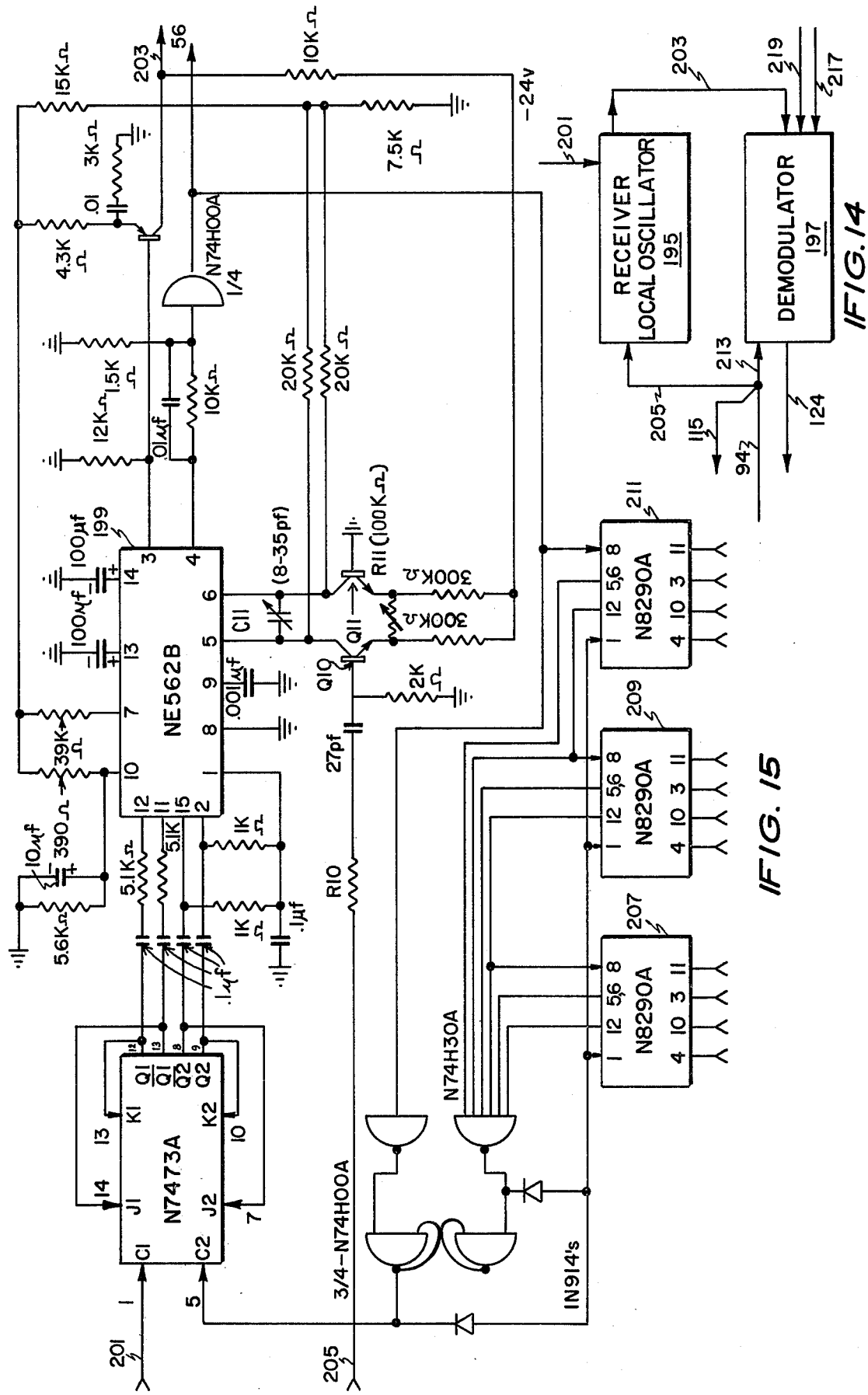

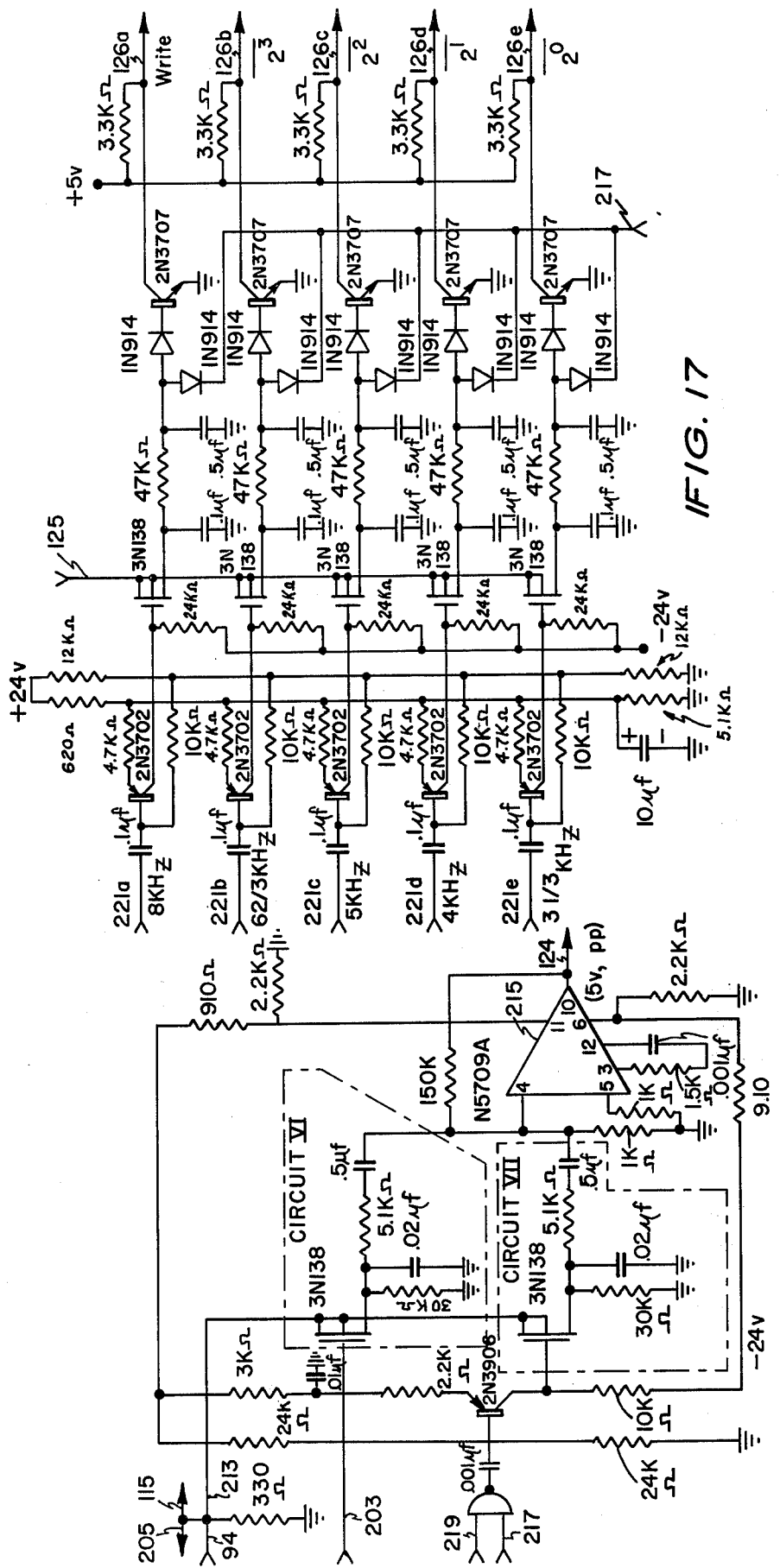

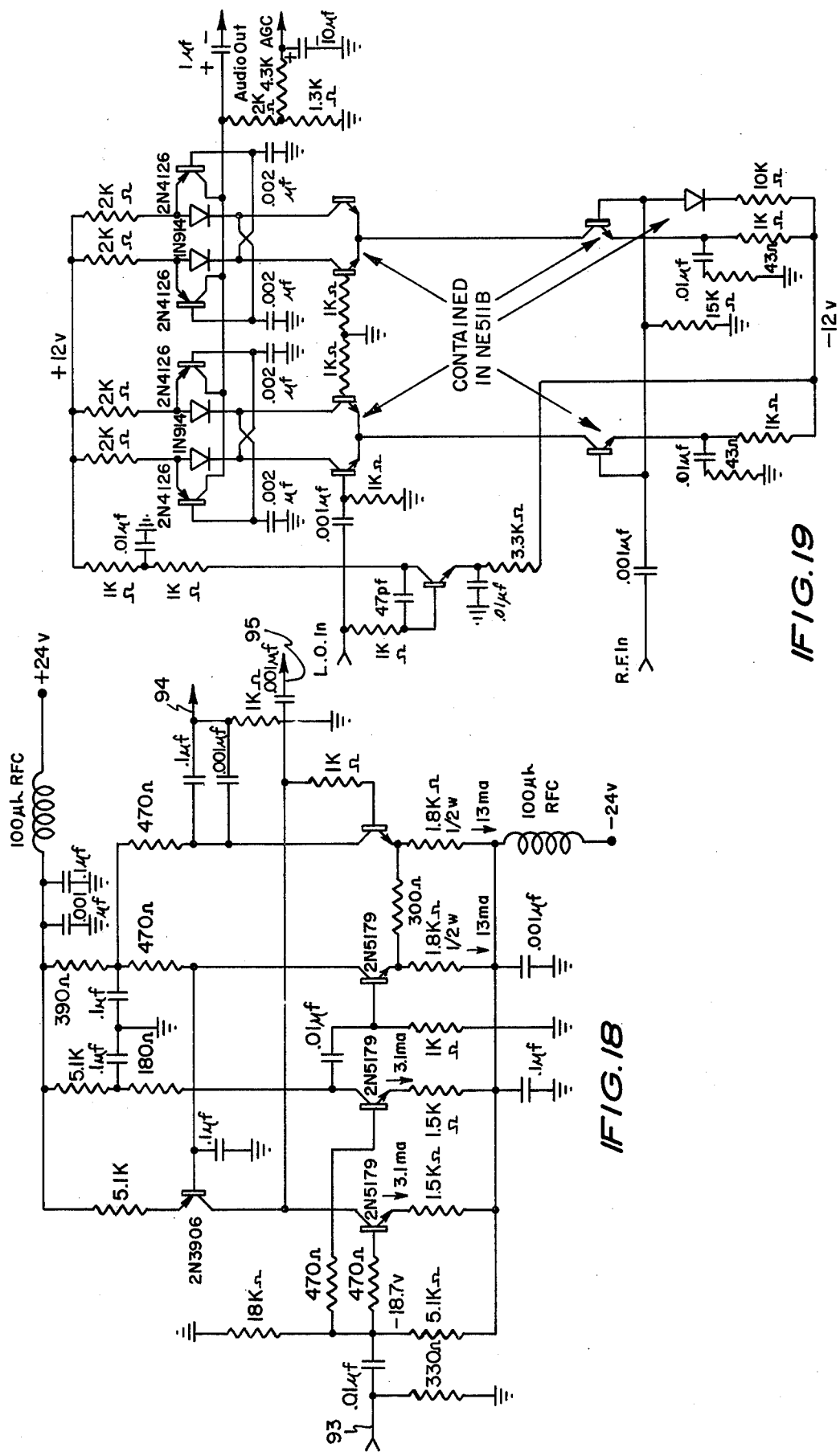

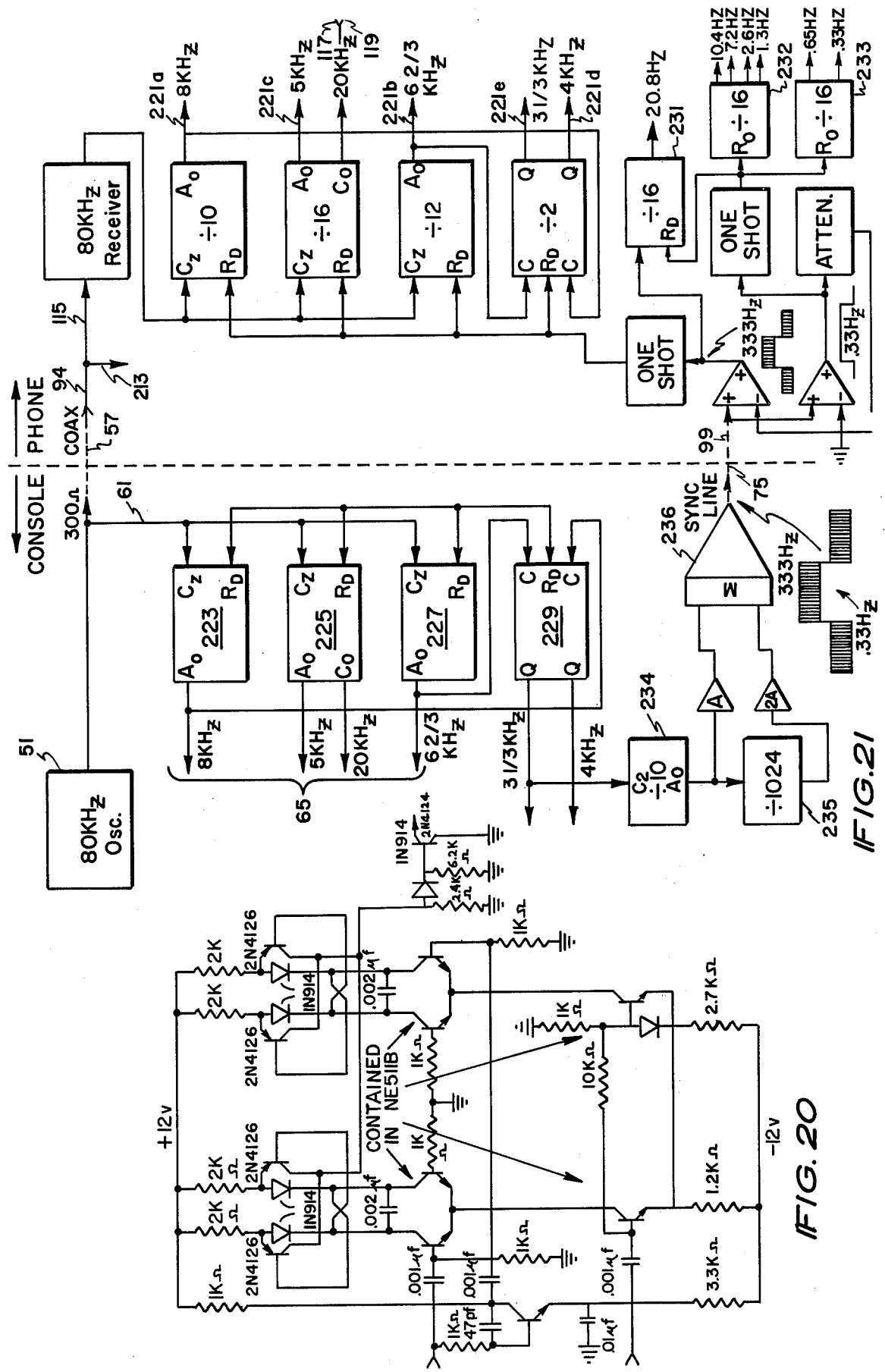

RANDOM ACCESS, MULTIPLE STATION COMMUNICATION SYSTEM

This is a continuation of application Ser. No. 253,265, filed May 15, 1972, now abandoned.

BACKGROUND OF THE INVENTION

1. Field:

This invention relates to communication systems, particularly telephone systems, and provides a random access, multiple station system in which AM transmitters and receivers are interconnected by conductors.

2. State of the Art:

Multiplexing techniques are well-known. Such techniques have been applied to various types of carrier transmission systems.

U.S. Pat. No. 3,573,379 discloses a communication system with both frequency and time division techniques. According to that patent, control information is carried in audio channels in the form of a time-divided binary pulse steam. When a call is made from one station to another, the receiving station is signalled that it is being called and on which channel. The transmitting frequency of the receiving station is selected after the call is received. U.S. Pat. No. 3,550,134 discloses a phase-locked loop, double carrier transmission system which includes a feedback loop from a voltage-controlled oscillator to a phase detector. U.S. Pat. No. 3,509,462 discloses a transceiver system in which the transmitter and receiver loops are independently phase-locked. U.S. Pat. No. 3,555,195 discloses a time multiplex system with phase-locked controls. U.S. Pat. No. 3,513,264 discloses a controlled, random access, communication system wherein access from one station to another is through a control center; each system has a transmitter and a receiver, each of which has a plurality of available channels. U.S. Pat. No. 3,519,747 teaches the use of tone codes with respect to time to control a communication system which includes conferencing capabilities.

SUMMARY OF THE INVENTION

The communication system of this invention may be regarded as a group of AM transmitters and receivers (one of each comprising a telephone) communicating to each other and to an operator's console by RF transmission. Although technically feasible to broadcast in diverse media, for most applications, the RF energy is confined to conductors, typically within a coax cable, with each phone having its own tap into the cable. Power and synchronization signals may be provided to each phone through the same cable or through separate conductors.

Each telephone in the system comprises AM transmitter and receiver means, both controlled by a logic section (control means). The receiver is set to a single reception channel which is unique to that particular telephone. The transmitter can be tuned to any of the channels available in the system and thus broadcast to any of the telephones (or truck lines) within the system. The control logic is responsible for the automatic operation of the transmitter and receiver and for the transmission, reception, encoding and decoding of control codes sent back and forth between communicating phone units, and in certain instances, an operator's console. These codes control functions such as busy tone, dial tone, ringer, return call indicator, hold, transfer, conference, etc.

Means may be provided for the interception of incoming calls from outside the system and for interfacing the system with, for example, the terminating equipment of a telephone company. These means are conveniently provided in an operator's console, such a console also conveniently includes space for trunk line transceiver cards. If additional trunk lines are needed, they may be provided for in an auxiliary chassis located somewhere near the console. Any combination of phone units, trunk lines, tie lines and special purpose lines may be used, provided that the total number of channels in the system is not exceeded. A typical basic system of this invention will accommodate about 350 channels, but an exchange (comprised of one or more systems) may be expanded to any desired capacity, as explained more fully hereinafter. The operator's console may also include the logic section of the system.

Each trunk line card in the system may be regarded as a modified phone unit which receives audio signals from a trunk line and transmits the same to an inside receiver; i.e., a receiver within the system, on its assigned channel. The card also receives information from an inside transmitter on its own channel and demodulates it. The result is then applied to a trunk line. In systems using trunk line cards (or comparable trunk line interfacing means) a trunk-line scanner means initially receives all outgoing calls and locates a free trunk-line card for that call. The outgoing call is then automatically transferred onto that free card.

The receiver of each telephone comprises a precise local oscillator; i. e., a coherent oscillator, which is turned in frequency to a particular unique channel. This channel corresponds to a call number assigned to the telephone. The telephone number may be changed when desired by setting the local oscillator to a different channel. The coherent oscillator normally free-runs on the channel to which it is set until an incoming signal arrives. The coherent oscillator locks itself in phase with the incoming signal, and produces a coherent local oscillator signal. This signal is heterodyned with the incoming signal, resulting in the reproduction of the transmitted audio information.

The transmitter comprises a carrier oscillator, which is also a phase-lock circuit. The carrier oscillator provides an ultra-stable frequency upon which the audio signals are modulated and transmitted. This carrier frequency is selected according to the equation $f_c = (999 - N)20$ KHz, assuming that the channels in the system are divided by 20 KHz. Thus, for example, if the number 204 is dialed, the transmitter will broadcast at 15.920 MHz. This same equation applies to the receiver-local oscillator discussed hereinbefore. Thus, the phone which is set to number 204 will respond to and extract the audio information being braodcast at 15.920 MHz. In addition to the carrier oscillator, the transmitter desirably includes a modulator and circuitry to control the operating frequency.

The control section of the claimed communication system may take various forms, but it conveniently comprises a tone encoding-decoding system which can transmit different tone-code combinations out on the carrier. In that event, the modulator in the transmitter desirably includes a tone-code input. Ten such tone-code codes are used for the transmission of the numerals 0 through 9. One or more others are used for control functions. A five-tone encoding-decoding system capable of transmitting 16 different tone-code combinations thus provides up to five surplus codes which may be used for additional purposes in the system. The tones are transmitted and received along with the regular vocal audio; however, during the transmission of a code the vocal audio is desirably momentarily inhibited. To insure the reliability of receiving the right number or code, special coherent-tone demodulators may be used. Demodulators which are phase and frequency sensitive and respond only to a specific tone of the proper phase are available. Such a coherent demodulator detects the presence of a signal with very low probability of error. Coherent systems require a reference signal of the exact frequency and phase of the expected incoming signal. Accordingly, a synchronization line is provided in conjunction with the coax cable. The synchronization line typically carries two master tones from which all code-tones are easily generated and phased. Each telephone unit may thus have five interval tones available which are exact duplicates in frequency and phase to those of all other telephones in the exchange. These interval tones are conveniently used in transmitting numerals and codes and in referencing the respective receiver's coherent demodulators.

The control section of the telephone may include memory means to record the occurrence of a call which has been unanswered. The identification of the calling station may be recorded and associated alert means and/or display means may be provided to inform the operator of the called station so that the call may be returned. Certain embodiments provide for automatic return of the call to the recorded telephone station without manual dialing.

BRIEF DESCRIPTION OF THE DRAWINGS

In the drawings, which illustrate what is presently regarded as the best mode for carrying out the invention:

FIG. 1 is a simplified block diagram illustrating a preferred unit arrangement of the invention;

FIG. 2 is a block diagram showing the arrangement of components conveniently located in an operator's console;

FIG. 5 is a schematic diagram of practical phase detector circuitry;

FIG. 6 is a schematic diagram of a practical sample-and-hold circuit;

FIG. 7 is a schematic diagram of a practical filter and amplifier circuit, including compensator and gain control elements;

FIG. 8 is a schematic diagram of a practical voltage tuned oscillator circuit;

FIG. 9 is a schematic diagram of a practical logic circuit for controlling the range of the oscillator of FIG. 8;

FIG. 10 is a schematic diagram of a practical variable modulus counter;

FIG. 11 is a schematic diagram of a practical modulator circuit;

FIG. 12 is a schematic diagram of a practical audio gate circuit;

FIG. 13 is a wave form chart illustrating the operation of the carrier generator of FIG. 4;

FIG. 14 is a block diagram of a typical receiver;

FIG. 15 is a schematic diagram of a practical receiver local oscillator circuit;

FIG. 16 is a schematic diagram of a practical demodulator circuit;

FIG. 17 is a schematic diagram of a practical tone decoder circuit;

FIG. 18 is a schematic diagram of a practical directional coupler circuit with a high impedance probe;

FIG. 19 is a schematic diagram of an alternative circuit useful as a receiver and tone decoder in the invention;

FIG. 20 is a schematic diagram of a synchronous demodulator circuit comparable to that of FIG. 19, but with somewhat improved tone decoding capabilities; and FIG. 21 is a diagramatic representation of a practical synchronization system.

DESCRIPTION OF THE ILLUSTRATED EMBODIMENT

Figure 3:
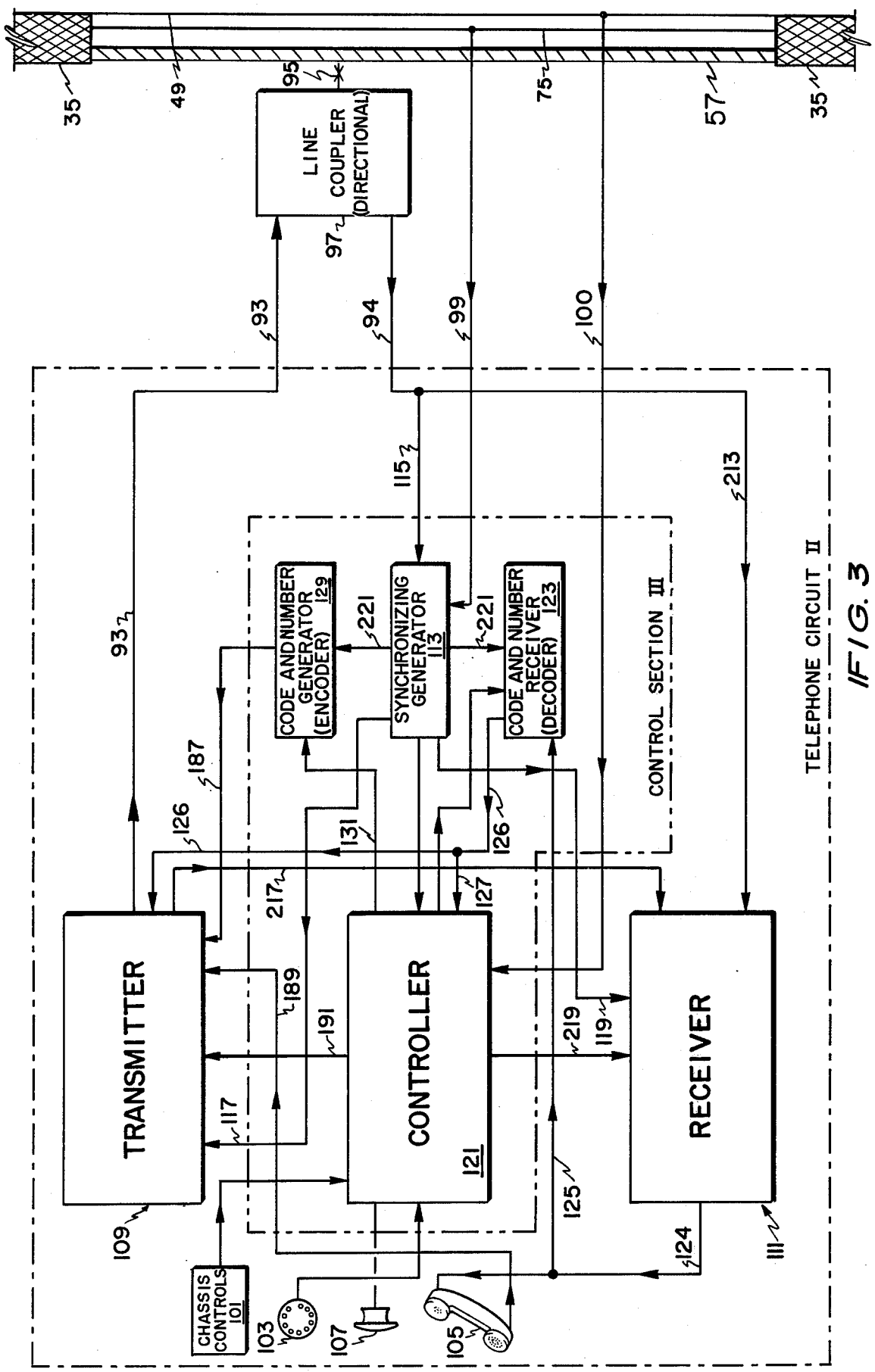
FIG. 3 is a block diagram of a typical station of the invention.

As illustrated by FIG. 1, individual stations 31 and an operator's console 33 are interconnected by a system cable 35 through tap lines 37. The legs 35a, 35b of the cable 35 may be extended to connect additional stations as required by the system.

The operator's console 33, illustrated in greater detail by FIG. 2, is a convenient location for those components necessary or desirable for system operation. As illustrated, console 33 includes a power supply 41 which receives outside electrical power through line 43, and converts it into several different power signals which are distributed to components within the operator's console 33 by separate conductors 45, 46, 47. Power is supplied to system stations 31 by separate power supply conductors 49, which may comprise a portion of the cable 35 as illustrated. One single conductor may be used to distribute power throughout the system with minor changes to the power supply 41.

System control means I may include an oscillator 51, a master signal generator 53, and a synchronizing generator 59. Oscillator 51 supplies an 80 KHz reference signal throughout the system through a coaxial cable 57 (shown as a portion of the system cable 35), and to a synchronizing generator 59 through a conductor 61. The synchronizing generator 59 divides the 80 KHz master signal and provides a reference signal to the master signal generator 53 through conductor 63. It may also distribute synchronizing signals through conductor 65 to trunk line cards 67 shown contained within a trunk line card holder 69. These signals may optionally be applied via conductor 71 to an incoming call interceptor 73.

As shown, the master signal generator 53 generates both 333 Hz and 0.33 Hz master signals and supplies them throughout the system over synchronizing line 75 (also shown as a portion of system cable 35).

The portion of the illustrated console 33 exclusive of the power supply 41 and system control means I components comprises external telephone system interfacing means. These means include a trunk line scanner 77, a transfer device 79, converters 81 (to convert internal control signals to external dial signals), and trunk line cards 67, which together provide means to interface the invention with typical commercial telephone systems.

In operation, the trunk line scanner 77 receives a control signal from an inside station 31 (FIG. 1) through the coaxial cable 57, requesting a trunk line 82 (outside line). The trunk line scanner 77 checks for an available (not in use) trunk line card 67. If a trunk line card 67 is available, the scanner 77 causes the transmitter of the inside station 31 to be tuned to the available trunk line card 67 and the transmitter of the trunk line card to be tuned to the receiver channel of the inside station. The logic for implementing these retuning operations is contained in a transfer device 79. The inside station 31 is then automatically enabled to place a call outside the system over trunk lines 82 (e.g., telephone company lines), as explained more fully hereinafter.

The optional incoming-call-interceptor 73 may be provided with any combination of typical operator (attendant) features desired or necessary for a particular installation. Typically, it would be connected by a conductor 83 to intercept incoming calls and a conductor 85 to permit transfer of an intercepted call to an inside station. Connection may also be made with the coaxial cable 57 by a conductor 87, and with synchronizing generator 59 by a conductor 71 to provide inside operator capabilities. Additional features, for example, automatic answering service capability or an automatic security/alarm system may similarly be incorporated in connection with the interceptor 73, if desired.

A typical station 31 (FIG. 1), such as that illustrated by FIG. 3, comprises a telephone circuit II, interconnected by conductors 93, 94 and 95 through a line coupler 97, as shown, to the aforementioned coaxial cable 57. Separate conductors 99, 100 interconnect the telephone circuit to synchronization 75 and power 49 conductors, respectively.

The illustrated telephone circuit II may be installed on a common telephone chasis, and may be equipped with common chassis controls 101, such as a cradle button and front panel buttons (e.g., hold button, transfer button), as well as a signaling device, such as the signal dial 103 shown. A conventional combination microphone and speaker hand set 105 is provided in addition to a ringer 107. Internally, the telephone circuit II consists of a transmitter 109, a receiver 111 and a control section III.

Within the illustrated control section III, a synchronizing generator 113 receives the aforementioned 80 KHz master signal from the line coupler 97 via conductors 94 and 115, and the aforementioned 333 Hz and 0.33 Hz master signals from the synchronizing line 75 via conductor 99. This generator 113 distributes various synchronizing signals to the transmitter 109 over conductor 117, to the receiver 111 over conductor 119, and to the other components in the control section III as shown. A controller 121 within the control section III receives electrical power from the power supply lines 49 through conductors 100, and subdistributes control power as needed throughout the telephone circuit II. In addition, the controller 121 sends and receives various control signals to and from the components in the control section III and the remainder of the telephone circuit II as explained more fully hereinafter.

A code and number receiver (decoder) 123 is included within the illustrated control section III. It receives coded control signals from the receiver 111 over conductors 124 and 125. It decodes the signals and supplies corresponding control signals to the controller 121 via conductors 126 and 127, to cause ringer 107 actuation, and to the transmitter 109 via conductor 126 to cause it to set up on the frequency band of the receiver of a calling station 31 (FIG. 1). A code and number generator (encode) 129, also included within the control section III, receives dial information from the dialing device 103 via the controller 121 and supplies coded signals for transmission throughout the system and reception by the dialed (called) station.

If the called station is in use, the controller 121, upon receiving no reply from the called station, applies an internal control signal via conductor 131 to the encoder 129, causing it to generate codes correlating to a busy signal for the called station.

Figure 4:
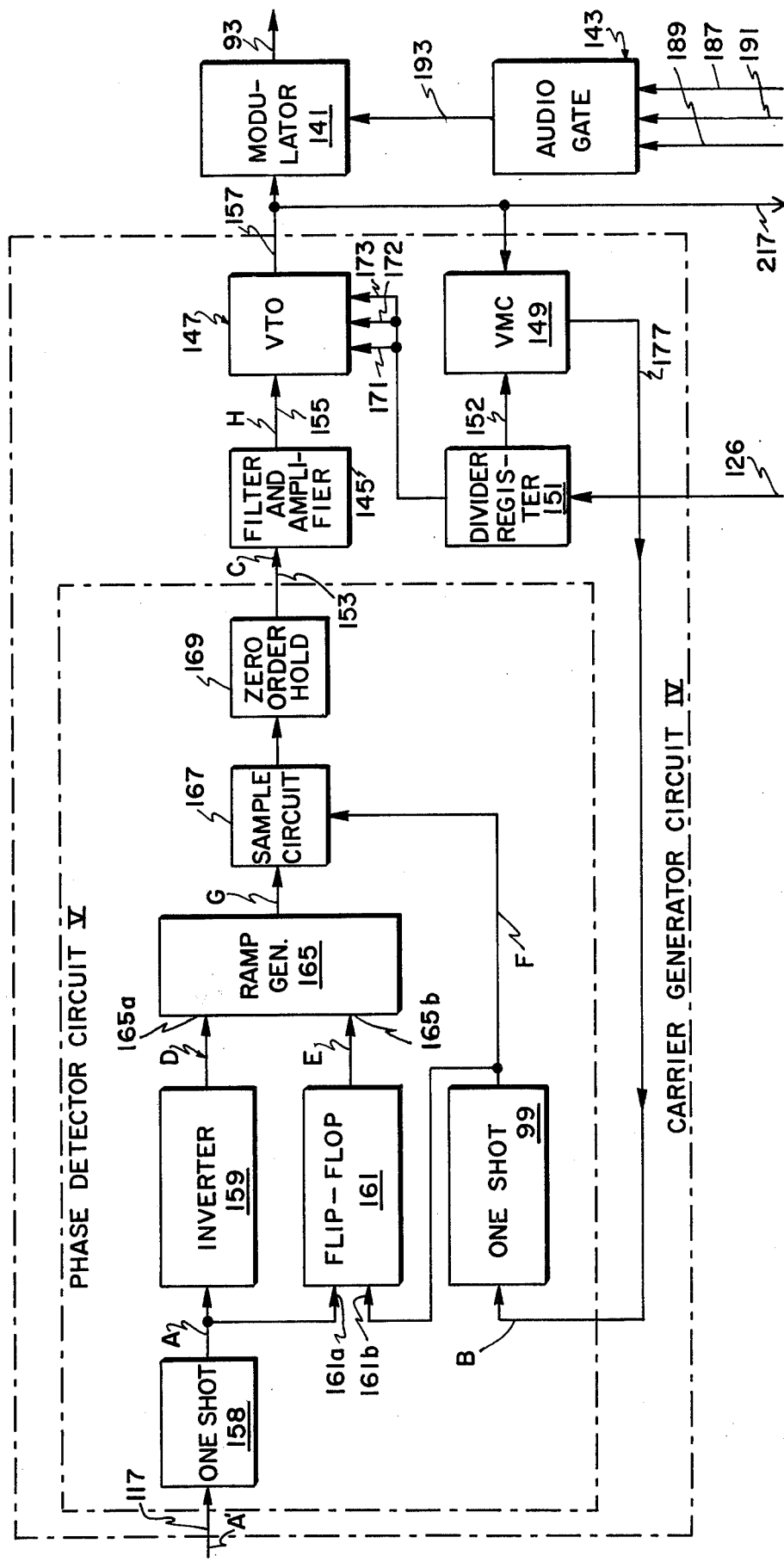
FIG. 4 is a block diagram of a typical transmitter.

Referring to FIG. 4, a typical transmitter 109 includes a carrier generator circuit IV, a modulator 141, and an audio gate 143. The carrier generator includes a phase detector circuit V, filter and amplifier means 145, voltage tuned oscillator (VTO) 147, variable modulus counter (VMC) 149 and divider register 151 connected as a phase-lock system. The system illustrated is designed to tune over 350 discrete channels separated by 20 KHz from 10 MHz to 16.98 MHz. Because a phase error controls the output frequency and a phase error is essentially the derivative of a frequency error, the phase detector V serves as an integrator, making the overall loop a Type 1 feedback control system. Due to the presence of the divider, register 151 in the loop, the oscillator 147 produces from about 500 to about 850 cycles for each cycle processed by the phase detector V. Any ripple present on the phase detector output 153 (signal C, FIG. 13) thus causes some FM deviation in the output frequency. It is desired that the first order FM sidebands be kept below 5% of the carrier. Excessive amplitude in these sidebands would cause cross talk between adjacent channels.

In the illustrated instance, the ripple frequency is 20 KHz and $m_f$ (FM modulation index) is 0.1. Thus, the maximum allowable deviation is $\pm$ 2 KHz. The input ripple ($e_r$) on the fine tune input 155 to the VTO 147 should thus be low enough to cause less than 2 KHz deviation in the VTO average output 157. The maximum allowable $e_r$ for the illustrated circuit can be calculated to be about $\pm$ 10 mv. The tuning range of the carrier generator IV illustrated by FIG. 4 is desirably divided into 8 bands for several reasons. A practical tuning diode to cover the whole range is not presently available. (The 8 ranges are created by switching fixed coarse range capacitors into the oscillator tank circuit, thus using the tuning diode as a bandspreader). The loop-gain-bandwidth product required by the phase lock system is drastically reduced by the division of the range into 8 bands. (The loop could not achieve lock over the whole range of channels otherwise.) The VTO sensitivity may thus be reduced, allowing much less FM noise at the oscillator output per millivolt of input ripple.

An important specification for the phase lock loop (which can be determined by conventional methods) is the gain-crossover bandwidth required for the system to achieve lock. In the illustrated instance, at least unity gain in the loop is required at 2.37 KHz. The present disclosure is based upon a design wherein the transmitter actually has a gain-crossover of 2.5 KHz.

To meet the 20 mv. peak to peak (p–p) riple (max.) and the 2.5 KHz bandwidth simultaneously, the phase detector V must approach an optimum demodulator with cardinal hold. Because low noise performance depends mainly on phase locked operation, when the phase detector output signal is DC, a zero order hold is ideal. Such a detector can be constructed which will produce no more than 10 mv. p–p, (spike fundamental), at the 20 KHz reference frequency.

The operation of the phase detector V will be best understood by reference to the waveform chart of FIG. 13. If the frequency of reference signal A ' is slightly greater than the frequency of feedback signal B, the output signal C will gradually increase. An increase in signal C applied to the VTO input 155 through filter and amplifier means 145 causes signal B to increase. Signal A' is applied through a one shot 158 to an inverter 159 and a first input 161a of a flip-flop device 161 while signal B is applied to a second input 161b of the device 161 and to a one shot 99. The output signals D and E from the inverter 159 and flip-flop 161 are applied to respective inputs 165a, 165b of a ramp generator 165.

The ramp generator 165 converts the phase difference between A' and B into a voltage proportionally related to that difference. The ramp 165 is started and stopped by the signal E and reset to its preramp condition by signal D. The delay between the stopped ramp and reset allows the sample circuit 167, which is actuated by signal F (received from one shot 99) to take a wide, easy sample without the ramp portion of signal G feeding through to the VTO 147. The output signal C from the zero order hold circuit 169 is fed through filter and amplifier means 145 as a fine tune input signal H of the VTO 147.

FIGS. 5 and 6 are practical circuits which together correspond generally to the phase detector V illustrated in FIG. 4. FIG. 5 corresponds generally to the ramp generator 165, flip-flop device 161, inverter 159 and one shot 99, while FIG. 6 corresponds generally to the sample circuit 167 and zero order hold device 169. The operation of both practical circuits is apparent from the wave form charts of FIG. 13.

In the illustrated instance, the VTO 147 input range is 10 volts (+ 5v to +15v), the DC amplifier 145 between the phase detector V and the VTO 147 has a gain of 3.5, and the phase detector V has a range of 2.9 volts, centered around +5v, the center of the ramp portion of signal C. During locked operation, the phase detector output signal C is thus in the range +3.55v to 6.45v. The holding capacitor C2 must be small enough to charge from one value in this range to any other value in the range during one sample time. For the circuit illustrated by FIG. 6, assuming a sample time of about 3 microseconds, a practical value for the holding capacitor C2 is about 3000 pico farads.

The practical circuit illustrated by FIG. 7 functions as a DC amplifier, compensator and filter which is adaptable to the present invention (145, FIG. 4). It exhibits a gain of 3.5 with an offset to translate the ±5v centered input to a ±10v centered output, a high input impedance and low bias current, such that the holding capacitor C2 (FIG. 6) will not leak off charge between samples, an adequate output limiting characteristic such that the output cannot exceed the range ± 5v to ± 15v (otherwise, the VTO would oscillate outside its bands, requiring higher loop bandwidths to achieve lock), and sufficient compensation to provide a forward transfer function zero at 630 Hz and poles at 1260 Hz, 10 KHz and 10 MHz.

The practical oscillator circuit of FIG. 8 is a Hartley type using an MOSFET transistor Q1. Tuning is accomplished by combining a coarse tune signal received from the divider register 151 (FIG. 4) and the fine tune signal H. Coarse tuning is achieved through the use of switching transistors Q2, Q3, Q4 adding capacitances C3, C4, C5, respectively, across the tuned circuit in binary steps. Fine tuning is handled by a voltage variable capacitance diode D1. Biasing for the oscillator MOSFET Q1 is provided by an RC-diode network, as shown.

The divider register 151 receives control signals (corresponding to the numbers assigned to calling stations) from the decoder 123 and controller 121 (FIG. 3) and converts them into the course tune signal supplied to the VTO 147 (FIG. 4) and a divisor signal to a frequency divider or variable modulus counter (VMC) 149. Although the actual electrical signals supplied to the VTO 147 and VMC 149 may differ, they correspond to the same numerical quantity as does the control signal transmitted to the divider register 151. The result is a VTO output signal which is determined in accordance with the expression $fo = (99-N) fr$, where $fo$ = the frequency of the VTO output signal;
$N$ = the number assigned to the station called
$fr$ = the frequency of the reference signal A'.

and a feedback signal (VMC input signal) equal to $fo$ divided by N. The carrier generator IV may then phase lock with the reference frequency (signal A') while the output signal carried by the output 157 of the generator IV is variable.

The logic circuit illustrated in FIG. 9 is suitable for inclusion in the divider register 151. It provides for the 8 coarse ranges or bands of the tuning range referred to hereinbefore. The outputs 171, 172, 173 of this logic circuit drive the capacitor switching transistors Q2, Q3 and Q4 of the VTO 142. The output signals of the outputs 171, 172, and 173 are timing voltages derived through the circuit from the voltage to the inputs 174. Practical numerical equivalents to the voltages appearing at the inputs 174, and throughout the circuit, are shown.

The practical circuit illustrated in FIG. 10 may be employed as the VMC 149 of this invention. The circuit illustrated is a digital circuit using high-speed counters. Of special significance is the strobe preset time and the propagation delay through the various gates leading to the data strobe line. This feature permits some diode logic to be utilized to eliminate excessive inversion type gates. As shown by FIG. 4, the output signal of the VMC 149 is supplied through a conductor 177 as the phase detector input signal B.

The modulators used with the claimed system should be free from distortion of the input signals. The frequency range of operation should be chosen to be as wide as practical without occupying a whole octave. Any harmonics present, or generated on the lower channel carrier frequencies (e.g., 10 MHz) are thus beyond the range of any receiver in the system, the first harmonics appearing at about 20 MHz and beyond. This arrangement allows the carrier to be rather non-sinusoidal, simplifying the overall transmitter and eliminating the need for filtering. On the other hand, the audio should be relatively free from harmonics beyond 10 KHz as these will be audible in the adjacent channel. Although special filtering can be employed to prevent signals above 10 KHz from reaching such a modulator, care should be taken to ensure that the modulator does not generate harmonics of these signals, and distort the original information. A wide-band, linear amplifier, such as that illustrated by FIG. 11, which achieves linear multiplication by adding the logarithms of the involved inputs and then taking the anti-logarithm of the sum is suitable and may be used as the transmitter modulator 141. The logarithmic elements involved are the base-emitter diode junctions of the high frequency transistors Q6, Q7, Q8, Q9.

As best shown by FIG. 3, the modulator output 93 drives a coax cable (e.g., 300 ohm) leading from the telephone circuit II to a directional coupler 97. A practical carrier level on line 93 is about 2 volts p-p, whereas the corresponding practical RF input level into the modulator 141 (FIG. 4) would be 4 volts p-p. The carrier generator IV of the transmitter 109 may be gated to the modulator 141 through conventional T$^2$L circuitry. The audio, however, is preferably gated to the modulator 141 through a special linear gate 143 for its inhibition and transmission. A suitable audio gating and input circuit is shown by FIG. 12. It combines the encoder output 187 (FIG. 3) with the gated vocal audio signal received via line 189 from a microphone, such as handset 105. Gating of the vocal audio signal is controlled by a control signal received from the controller 121 via line 191. The audio gate 143 output is applied to the modulator 141 via line 193.

FIG. 14 depicts a practical receiver adaptable for use in the present invention 111 (FIG. 3). The receiver includes a local oscillator 195 and a demodulator 197. Phase locking of the receiver local oscillator is desired to permit coherent operation of the receiver 111 thereby to eliminate the need for many common receiver components (e.g., filters and intermediate frequency devices). FIG. 15 illustrates a practical receiver local oscillator circuit suitable for this purpose. A conventional integrated circuit 199, containing a voltage tuned oscillator (VTO), a phase detector, and a DC amplifier may be used, as shown. The phase lock loop is completed by adding the requisite frequency divider and filtering components. As with the transmitter carrier generator IV (FIG. 4), the local oscillator 195 is phase locked to a 20 KHz reference signal supplied over line 201, thus providing an output signal over line 203 averaging an exact multiple of 20 KHz. The ripple on the phase detector outputs of the integrated circuit 199 illustrated is much greater than that on the output of the discrete transmitter circuit (signal C) discussed hereinbefore. Because the receiver 111 need only lock on a single channel, its bandwidth requirements are only a fraction of that needed by the transmitter 109. This allows heavy filtering to be applied to the phase detector output signal, greatly reducing the ripple on that line. One further feature of the receiver phase lock circuit not present in the transmitter phase lock circuit V is the phase pulling input which synchronizes the receiver local oscillator 195 with the arriving transmitter carrier signal over line 205. This feature assures the proper phasing of the signals to be mixed in the demodulator 197.

The local oscillator of FIG. 15 includes a phase control input 205 to cause its output 203 to be in phase with the received carrier whenever such a carrier is present. This control is provided by the differential amplifier Q10, Q11 placed across the VTO timing capacitor C11. Any signal close to the free-running VTO signal which is present on the receive-line, will tend to pre-trigger the timing capacitor C11 in such a manner as to cause phase lock to that signal. The resistor R10, and the potentiometer R11 are set to apply the proper pulling level to the timing capacitor C11. The free-running VTO frequency is set by adjusting counters 207, 209, 211 to provide for a local oscillator output frequency correlating to a station's (31, FIG. 1) assigned telephone number.

The summing amplifier 215 illustrated in FIG. 16 receives the combined output of the two mixers VI, VII and dial-tone and busy-signal signals from the controller 121 on line 219. The amplifier output line 124 is supplied to the handset 105 for audio reception, and to the decoder 123 for decoding of incoming control signals. The dial tone may, for example, be a steady 333 Hz tone. A busy tone may be 80 Hz, gated on and off at intervals. Decoding may be accomplished by a tone decoder such as that illustrated in FIG. 17 which is a coherent demodulator followed by a low pass element of sufficient time constant to ensure highly reliable operation. As illustrated, the codes are transmitted over a 100ms interval. The decoder is continuously operational but its output is sampled only for the last 50 ms of the 100ms transmit interval. Thus, the decoder-demodulators have 50ms in which to respond and settle into the state indicated by the incoming code. The input signal on line 217 serves to disable the tone decoder during periods in which the transmitter 109 is transmitting codes. The ambiguity of receiving a control code and possibly transmitting one at the same time is thus eliminated. The synchronizing generator 113 (FIG. 3) provides a plurality of reference signals across the line 221 to the decoder, and the decoder develops a plurality of output signals on the line 126.

FIG. 18 illustrates practical circuitry which enables a telephone station 31 (FIG. 1) to tap into the system coax cable 57 (FIGS. 2, 3) without causing severe, mismatch reflections and losses. The circuit illustrated includes a high impedance transmitting and receiving probe for connection to an inner conductor of the coax cable 57. The probe circuitry also separates the transmitted signal from the received signal in similar fashion to a directional coupler, providing some receiver isolation from the transmitter 109. This isolation provides some attenuation to the transmitted audio in the handset 105 during conference communication. Somewhat simpler circuitry may be used in systems which do not require conference call capabilities, because the direction sensitive coupling aspects of the circuit may then be dispensed with.

For normal operation, a simple mixer circuit would suffice as a demodulator, because it would need to demodulate only the signal received from a calling station over line 213. A demodulator circuit such as those illustrated by FIGS. 16, 19 and 20 are highly preferred, however, because they provide conference call capability to the system. This capability is achieved by setting up the receivers of various conferencing telephone stations to receive on their transmitting frequencies, and then arranging for the transmitter of the conferencing stations to transmit on a common channel. The manner in which conferencing is accomplished will be better understood by specific reference to FIG. 16.

The demodulator circuit illustrated by FIG. 16 is comprised of two separate mixer circuits VI and VII, a summing amplifier 215 and associated circuitry. Mixer VI functions during the normal mode of telephone communication for demodulation of incoming signals by mixing the signals carried by the output 203 of the receiver local oscillator 195 (FIG. 14). The mixer VII functions during the conference call mode of communication. It receives, as a local oscillator signal over the line 217, the output signal of the carrier generator circuit IV (FIG. 4) of the transmitter of its own station. The conference call mode is initiated by, for example, depressing a conference call button on the front panel controls (101, FIG. 3) of the station desiring to initiate a conference call. By this or other means, an appropriate gate signal is applied on line 219 to admit the aforementioned local oscillator signal over line 217. This signal permits mixer VII to demodulate all signals present on the receiver line 213 at or near the frequency of the carrier signal of the transmitter of its own station. In effect, the station is then capable of receiving on whatever channel it transmits on, rather than on its assigned receiver channel. A plurality of stations may be similarly set, through transmittal coded control signals or by other means, to receive on their transmit channels. By all transmitting being on the same channel, these stations can then all receive and transmit to each other. Of course, several such conference calls can be handled simultaneously in the system through different selected channels.

As mentioned hereinbefore in connection with FIG. 2, a plurality of trunk-line cards 67 may be relied upon to interface with other telephone systems. Each of these cards 67 may be regarded as a separate telephone circuit including transmitter and receiver means generally similar to those previously described herein. The procedures and operations involved in placing a call from an inside station 31 to a telephone outside the system will be better understood by reference to the previously described figures of the drawings.

Upon receipt of a dial tone, the control code indicating the availability of a trunk line, the inside station transmitter 109 sets up on the receive band of the assigned trunk-line card 57. When an external phone number is dialed, it is converted from an internal control signal to an external dial signal by converter means 81 (FIG. 2). After the connection with the external telephone is complete, the trunk-line card 67, which operates as a modified telephone circuit, receives the transmitted signal from the inside station 31, extracts the audio portion thereof, and sends that portion out to the external telephone. The card 67 also receives the audio from the external telephone and transmits it to the inside station 31 on the receive channel on the inside station 31. Incoming calls from an external telephone system are handled in a similar fashion. Inside stations 31 may be modified to prevent the origination of outgoing calls, without preventing reception of incoming calls, or they may be modified to prevent them from either receiving or originating outside calls.

FIGS. 19 and 20 illustrate alternative circuits which may be incorporated in the system of this invention to function as receivers and tone decoders. The circuit of FIG. 20 is particularly useful as a tone decoder and has many applications outside the system disclosed herein.

Coordinated operation of the claimed system is provided by the synchronization of the several aforedescribed circuits in each station 31 to all other such circuits in all other stations in the system. The following list illustrates practical values of synchronizing signals consistent with the specific circuits of the drawings and the practical values referred to hereinbefore in the disclosure.

80 KHz Master control signal
20 KHz Reference signal
8 KHz Tone code
6⅔ KHz Tone code
5 KHz Tone code
4 KHz Tone code
3⅓ KHz Tone code
333 Hz Master control signal
20.8 Hz Interval generation signal
10.4 Hz Interval generation signal
5.2 Hz Interval generation signal
2.6 Hz Interval generation signal
1.3 Hz Interval generation signal
0.65 Hz Interval generation signal
0.33 Hz Master control signal FIG. 21 shows how all of these signals may be generated in the console 33 and in each telephone circuit II from three basic master signals. One of these master signals (80 KHz) is transmitted down the coax cable 57 along with the frequency band channels; the other two are low frequency pulses and may be sent down a synchronizing line 75. These conductors may be provided within one cable, but are usually more conveniently provided separately. Referring to FIG. 21, the generation of the synchronization signals occurs in two groups. In the higher frequency group (20 KHz, 8 KHz, 6⅔ KHz, 5 KHz, 4 KHz, 3⅓ KHz), the 80 KHz tone is divided down appropriately to each frequency in the group. In order to maintain the proper phase coincidence among the various divided-down signals, a 333⅓ Hz tone resets all the various counters 223 through 230 simultaneously. In the lower frequency group, the 333⅓ Hz tone drives the counters 231, 232 and 233 to produce 20.8, 10.4, 5.2, 2.6, 1.3, and 0.65 Hz signals. These are brought into coincidence by the 0.33 Hz signal which is produced by counters 234 and 235 in conjunction with summing amplifier 236.

Operation of the control section III (FIG. 3) which transmits and receives codes and numbers to cause operations such as ringing, busy tone, dial tone, etc., to occur in the telephone circuit II as well as to cause connections, transfers, holds, outside dialing, etc., is set forth in the following tables. These tables are constructed on the assumption that the pulse train generator 55 (FIG. 2) is a time multiplexer utilizing 8 basic phases, $\phi_0, \phi_1, \ldots \phi_7$, divided into four subphases, $\phi_{0A}, \phi_{0B}, \ldots \phi_{7C} \phi_{7D}$. Codes are transmitted and received during the A subphases, allowing 8 slots in which codes can be transmitted. During subphases B, C and D, three digit numbers may be exchanged between stations 31, and then basic exchange and loading operations are performed inside each station 31. The legend for the tables follows Table 3.

TABLE 1

OPERATION SELECTION

| No. | Operation Description | Initial Cond. | | | | Sync. Interval En. | Sync. En. | Async Enable | Async Oper. | Final Cond. |
|---|---|---|---|---|---|---|---|---|---|---|
| 1 | Receiver Down (awaiting call) | Br | D | M | Mco Mlo Dlo | | | Br Mco φo Ci | | Br D M Mco Mlo Dlo |
| 2 | Incoming Call | Br | D | M | Mco Mlo Dlo | Br Mlo φo Ci | Sic | | 2 | Br D M Mco Mlo Dlo |
| 3 | Ringing phone | Br | D | M | Mco Mlo Dlo | | | | | Br D M Mco Mlo Dco |
| 4 | Caller hangs up | Br | D | M | Mco Mlo Dco | | | D Mco Mlo φC₁ | 4 | D M Mco Mlo Dco |
| 5 | Answer phone | Br | D | M | Mco Mlo Dco | | | Mlo Prbu | 5 | Br D M Mco Mlo Dco |
| 6 | Conversation | Br | D | M | Mco | Dlo | | | | Br D M |
| 7 | Req. Conv. Hang-up | Br | D | M | Mco | Dlo | | M Mlo Dco Prbd | 7 | Br D M Mco Mlo Dco |
| 8 | Non-Conv. Hang Up | Br | D | M | Mco Mlo Dco | M Mlo Dco Prbd | Srbd | M Prbd | 7 | " |
| 9 | Conf. initiator Hangs up | Br | D | M | Mco Mlo Dco | M Mlo Dco Prbd | Srbd | M Mco Dco Prbd | 7 | " |
| 10 | Conf. Guest hangs up | Br | D | M | Mco Mlo Dco | | | Dco Prbd | 7 | |
| 11 | Lift to dial | Br | D | M | Mco Mlo Dco | | | Mco Prbu | 11 | Br D M Mco Mlo Dco |
| 12 | Dial 1st Digit | Br | D | M | Mco Mlo Dco | Pds | Sds | D Po1 | 12 | Br D M Mco Mlo Dco |
| 13 | Dial 3rd " | Br | D | M | Mco Mlo Dco | | | Po3 | 13 | Br D M Mco Mlo Dco |
| 14 | Connection Complete | Br | D | M | Mco Mlo Dco | | | Sd3 φ6 C1 | 14 | Br D M Mco Mlo Dco |
| 15 | Trunk or Tie-Line Conn. | Br | D | M | Mco Mlo Dco | Mco Mlo Dco φ3 C1 | Stp | Stp φ5 C1 | 15 | Br D M Mco Mlo Dco |
| 16 | Dial 1st Digit Outside | Br | D | M | Mco Mlo Dco | | | D Po1 | 12 | Br D M Mco Mlo Dco |
| 17 | Dial Outside Complete | Br | D | M | Mco Mlo Dco | | | D Mco Mlo φ1 C1 | 16 | Br D M Mco Mlo Dco |
| 18 | Place Party on Hold | Br | D | M | Mco Mlo Dco | M Mlo Dco Pbm | Sml | M Mco Dco φ4 C1 | 18 | Br D M Mco Mlo Dco |
| 19 | Placed on Hold | Br | D | M | Mco Mlo Dco | | | M Mlo Dco φ4 C1 | 19 | Br D M Mco Mlo Dco |
| 20 | Release party from Hold | Br | D | M | Mco Mlo Dco | Pbh | Shr | Pbh | 20 | Br D M Mco Mlo Dco |
| 21 | Released from Hold | Br | D | M | Mco Mlo Dco | | | Br M Mco Mlo φ5 C1 | 21 | Br D M Mco Mlo Dco |
| 22 | Transfer Pty A to Pty B | D | D | M | Mco Mlo Dco | Pbt | St | Pbt | 22 | Br D M Mco Mlo Dco |
| 23 | Transfer Pty A | Br | D | M | Mco Mlo Dco | Mco Mlo Dco φ3 C1 | Stp | M Mco Mlo Dco φ3 C1 | 23 | Br D M Mco Mlo Dco |
| 24 | Transfer Pty B | Br | D | M | Mco Mlo Dco | Br M Mco Mlo φ6 C1 | Stp | Br M Mco Mlo φ2 C1 | 24 | Br D M Mco Mlo Dco |
| 25 | Place Pty on Conf. | Br | D | M | Mco Mlo Dco | M Pbc | Sc | Pbl | 25 | Br D M Mco Mlo Dco |
| 26 | Placed on Conf. | Br | D | M | Mco Mlo Dco | | | M Mlo Dco φ2 C1 | 26 | Br D M Mco Mlo Dco |
| 27 | Conf. Conv. | Br | D | M | Mco Mlo Dco | | | | | Br D M Mco Mlo Dco |
| 28 | Release Conf. Button | Br | D | M | Mco Mlo Dco | | | Pbc | 28 | Br D M Mco Mlo Dco |
| 29 | Request Return Call | Br | D | M | Mco Mlo Lpc | Mco Lpc Brc Prbd | Src | Mco Lpc Bpc Prbd | 29 | Br D M Mco Mlo Dco |
| 30 | Interrogate Call Log Mem. | Br | D | M | Mco Lpc | Pgpc | Spl | Pbrf | 30 | Br D M Mco Mlo Dco |
| 31 | Press Conf. Button w/o Pty | Br | D | M | Mco Dco Mlo | M Pbc | Sec | Pbl | 25 | Br D M Mco Mlo Dco |
| 32 | P.C. Returning Number | Br | D | M | Mco Mlo Dco | Br M φ5 C1 | Sm | Br M φ5 C1 | 32 | Br D M Mco Mlo Dco |

TABLE 2

SYNCHRONOUS INTERVAL OPERATION

| Sync. Interval | Int. Start | Int. Stop | φ0 A | φ0 BCD | φ1 A | φ1 BCD | φ2 A | φ2 BCD | φ3 A | φ3 BCD | φ4 A | φ4 BCD | φ5 A | φ5 BCD | φ6 A | φ6 BCD | φ7 A | φ7 BCD |
|---|---|---|---|---|---|---|---|---|---|---|---|---|---|---|---|---|---|---|
| Sic | I | φ7 | | | | | | | | | | | | | | | | |
| Srcd | Rp | φ7 | | | TC1 | | | | | | | | TC1 | | | | | |
| SD3 | Rp | φ7 | TC1 | T No. | TC1 | | | | | | | | | | | | | |
| Srp | I | φ7 | | | | | | | | | | | | | | | | |
| SHI | Rp | φ7 | | | | | | | | | R No. | | TC1 | V/A | | | TC1 | T No. |
| SHR | Rp | φ7 | | | | | TC1 | V/A | | | | | TC1 | V/A | TC1 | | | |
| Sr | Rp | φ7 | | | | | | | | | TC1 | TA No. | | | | | | |
| Str | I | φ7 | | | | | | | | | | | | | | | | |
| Sc | Rp | φ7 | | | | | | | TC1 | | | | | | | | R No. | |
| SRC | Rp | φ7 | | | | | V/A | | RC/V | | | | | | | | | |
| Spl | Rp | φ7 | | | | | | | RC/V | | | | TC1 | T No. | TA No. | | | |
| Scl | Rp | φ7 | TC1 | | | | | | | | | | TC1 | T No. | | | | |
| SRN | I | φ7 | | | | | | | | | | | | | | | R No. | |

TABLE 3

ASYNCHRONOUS OPERATION

| Async. Oper. | clear Unc | clear Dia. | Dial On | Dial Off | Mic. On | Mic. Off | Ear. On | Ear. Off | Ring On | Ring Off | Busy On | Busy Off | Mco On | Mco Off |
|---|---|---|---|---|---|---|---|---|---|---|---|---|---|---|
| 2 | I | | | | | | | | | | | | | |
| 4 | φ7 | | | | I | | I | | φ7 | | | | φ5 | |
| 5 | | | | | | I | | | | I | I | | | φ7 |
| 7 | φ7 | | | | I | | I | | I | | | | | φ7 |
| 11 | I | I | I | | | | I | | | | | | | |
| 12 | | | | | | | | | | | | | | |
| 13 | | | | φ2 | | | | | | | | | | |
| 14 | | | | | I | | | | | | I | | φ5 | |
| 15 | I | | φ7 | | | | | | | | | | | |
| 16 | | | | | I | I | φ7 | | | | φ7 | | φ5 | I |
| 18 | φ7 | φ7 | φ7 | | I | | | | | | | | | φ7 |
| 19 | | | | | | | I | | | | | | | φ7 |
| 20 | | | | | I | φ7 | | | | | I | | | |
| 21 | | | | | | I | | | | | | | I | |
| 22 | φ7 | φ7 | φ7 | | | | I | | | | | | | φ7 |
| 23 | | I | | | | | | | | | | | | |
| 24 | I | | | | | | | | | | φ5 | | | I |
| 25 | | | | | I | φ7 | | | | | φ7 | | | |
| 26 | | | | | | φ7 | | | | | I | | | φ7 |
| 28 | I | I | I | | | | I | | | | | | | |
| 29 | φ7 | | | | | | I | | I | | | | | |
| 30 | I,φ7 | | I | | | | | | | | I | | φ7 | φ7 |
| 32 | I | | | | | | | | | | | | φ7 | φ7 |

| Async. Oper. | Bl & Mco On | Bl & Mco Off | Dco On | Dco Off | Bm On | Bm Off | Loc On | Loc Off | Dt On | Dt Off | Lt on | Lt Off |
|---|---|---|---|---|---|---|---|---|---|---|---|---|
| 2 | | | | | 67 | | | | | | | |
| 4 | | φ7 | | | | | | | | I | | |
| 5 | | | | | | | | | | | | |
| 7 | | φ7 | | | | | | | | | | |
| 11 | | | | | | | I | | | | | |
| 12 | | | | | | | | | I | | | |
| 13 | | | | | | | | | | | | |
| 14 | | | | | | | | | | | | |
| 15 | | | | | | | φ7 | | | | | |
| 16 | | | | | | | φ7 | | | | | |
| 18 | | | | I | | | φ7 | | | | | |
| 19 | | | | | | | | | | | | |
| 20 | | | | | φ7 | | | | | | | |
| 21 | | | | | | | | | I | | | |
| 22 | | | | | | | φ7 | | | | | |
| 23 | | | | | | | φ7 | | I | | φ7 | |
| 24 | | | | | | | | | | | | |
| 25 | φ7 | | | | | | | | I | | | |
| 26 | | | I | | | | | | | | | |
| 28 | | I | | | | | | | | | | |
| 29 | | φ7 | | | | | I | | | | | |
| 30 | | | | | | | | | | | | |
| 32 | | | | | φ7 | | | | | | | |

LEGEND FOR TABLES 1 THROUGH 3

| | |
|---|---|
| Br, B̄r: | Receiver Button, up - down |
| BH: | Hold Button |
| BRC: | Return call button |
| C: | Code No. 1 |
| D, D̄: | Dial enable, disable |
| Dco, D̄co: | Carrier osc. to demodulator, not to demodulator |
| DT: | Dial tone |
| Lpc: | P. C. Button |
| LT: | Transfer Button |
| M, M̄: | Microphone, ON - OFF |
| Mco, M̄co: | Carrier osc. to modulator, not to modulator |
| MLO, M̄LO: | Local osc. to modulator, not to modulator |
| PBH: | Hold Button Pulse |
| PBT: | Transfer Button Pulse |
| PD1: | 1st Digit Dial Pulse |
| PD3: | 3rd Digit Dial Pulse |

-continued

| LEGEND FOR TABLES 1 THROUGH 3 | |
|---|---|
| PRBD: | Receiver button down-pulse |
| PRBU: | Receiver Button up-pulse |
| T No.: | Transmit phone number |
| TA No.: | Transmit aux. register contents |
| V/A: | Exchange contents of VMC and Aux. Registers |

The use of Tables 1 through 3 will be more readily understood by reference to the following example:

Assume No. 171 calls No. 284. The operation is as follows:

1. No. 171 lifts the receiver (row 11, Table 1). The action of lifting the receiver to dial causes the pulse PRBU to be generated, which gated with the conditions $\overline{MCO}$, initiates the events in Table 3, row 11. The I in this table indicates that the events occur immediately, as the input $\overline{MCO}$PRBU occurs. Thus, No. 171's phone is immediately enabled for dialing.

2. When No. 171 dials the first digit (2) the events in row 12, Tables 1 and 3 occur. That is, the dial tone stops. (see Table 3, row 12).

3. When the last digit (4) has been dialed (Table 1, row 13), the synchronous events in Table 2, SD3, occur as well as the asynchronous events of Table 3, row 13. Among other things, a code is transmitted to No. 284 along with the number 171 (see Table 2, row SD3, $\phi_0$).

4. The $\phi_0 C_1$, enters No. 284 (see Table 1, row 2). This causes the synchronous events in Table 2, row S1c, and the asynchronous events in Table 3, row 2, to occur. That is, among other things, a code $\phi_6 C_1$ is sent back to No. 171 indicating that a connection has been made or that the phone is available. The many other events also occurring can be traced out through the use of the Table in this fashion.

I claim:

1. A random access, multiple station communication system comprising:

a plurality of stations interconnected by transmit and receive conductors, each of said stations having transmitter means to transmit on various selected bands of transmission frequencies over the said interconnecting transmit and receive conductors a signal consisting of carrier and data components and receiver means adapted to receive transmissions from other stations only in said selected frequency band assigned to and identified with said receiver means;

a signal generator connected by control conductors to the said stations to generate intervaled pulse trains which are impressed on said control conductors evenly spaced over time as radio frequency signals in a frequency band different from the said various selected bands of transmission frequencies;

control means connected to said control conductors to operate and control the said transmitter and receiver means, said control means comprising means to generate coded control pulses and means to impress the said coded control pulses on the said intervaled pulse trains;

each of the said stations including means to achieve synchronization in phase and frequency with the said intervaled pulse train radio frequency signals; and means to interrupt the transmission of at least one of the said carrier and data components when the said control means receive and send said coded control pulses which consists of electromagnetic pulses or the absence thereof within the said intervaled pulse trains and convey control information between said stations to effect system control functions; and wherein a first said station including memory means and means to transfer an identity signal of at least one other station transmitted to the said first station to the said memory means.

2. A communication system according to claim 1, wherein the said memory means is connected to alert means and includes means to receive and retain the said identity signal and to actuate the said alert means.

3. A communication system according to claim 2, wherein said other station includes manual activation means to generate a call-back coded control pulse; and the first said station includes means to recognize and receive the said call-back coded control pulse and means to supply the identity signal of said other station to the said transfer means when the said call-back coded control pulse is received.

4. A communication system according to claim 3, wherein the said signal generator supplies a reference frequency to the said stations over the said control conductors; and the transmitter means has phase locking means to lock the said carrier component of the said transmitted signal in phase with the said reference frequency.

5. The communication system according to claim 4 wherein at least one station is removably connected to said conductors by first connector means and transportable to be connected to said cabling at locations different from said first connector means by second connector means.

* * * * *

UNITED STATES PATENT OFFICE
CERTIFICATE OF CORRECTION

Patent No. 4,020,289         Dated April 26, 1977

Inventor(s) Scott K. Anderson

It is certified that error appears in the above-identified patent and that said Letters Patent are hereby corrected as shown below:

Column 11, line 32, change "57" to ---67---;

Column 13, 14, 15 and 16, redo Table 1, 2 and 3 as per attached replacement tables. Tables 1, 2 and 3 contain a plurality of errors with respect to logic symbology reflected therein.

Signed and Sealed this

Fifteenth Day of November 1977

[SEAL]

Attest:

RUTH C. MASON
*Attesting Officer*

LUTRELLE F. PARKER
*Acting Commissioner of Patents and Trademarks*

Patent No. 4,020,289

TABLE 1
OPERATION SELECTION

| No. | Operation Description | Initial Cond. | Sync. Interval En. | Sync. En. | Ansync. Enable | Async. Oper. | Final Condition |
|---|---|---|---|---|---|---|---|
| 1. | Receiver Down (awaiting call) | Br D̄ M̄ Nco Mlo D̄lo | | | | | Br D̄ M̄ Nco Mlo D̄co |
| 2. | Incoming Call | Br D̄ M̄ Nco Mlo D̄lo | Br M̄lo φo C₁ | Sic | Br M̄co φo C₁ | 2 | Br D̄ M̄ Nco Mlo D̄co |
| 3. | Ringing phone | Br D̄ M̄ Nco Mlo D̄lo | | | | | Br D̄ M̄ Nco Mlo D̄co |
| 4. | Caller hangs up | Br D̄ M Nco Mlo D̄lo | | | | | Br D̄ M Nco Mlo Dco |
| 5. | Answer phone | Br D̄ M̄ Nco Mlo D̄lo | | | D̄ Mco M̄lo φ₁ C₁ | 4 | Br D̄ M Nco Mlo Dco |
| 6. | Conversation | Br D̄ M | | | Mlo Prbu | 5 | Br D̄ M |
| 7. | Req. Conv. hang-up | Br D̄ M Nco | | | M Mlo D̄co Prbd | 7 | Br D̄ M Nco Mlo D̄co |
| 8. | Non.-Conv. hang-up | Br M̄ | D̄lo | Srbd | M̄ Prbd | 7 | Br D̄ M̄ Nco Mlo D̄co |
| 9. | Conf.initiator Hangs up | Br D̄ M Nco Mlo D̄co | M Mlo D̄co Prbd | Srbd | M Mco Dco Prbd | 7 | Br D̄ M Nco Mlo D̄co |
| 10. | Conf. Guest Hangs up | Br D̄ M Nco Mlo D̄co | | | Dco Prbd | 11 | Br D̄ M Nco Mlo D̄co |
| 11. | Lift to Dial | Br D̄ M̄ Nco Mlo D̄co | | | M̄co Prbu | 11 | Br D̄ M̄ Nco Mlo D̄co |
| 12. | Dial 1st Digit | Br D̄ M̄ Nco Mlo D̄co | | | D Pol | 12 | Br D̄ M̄ Nco Mlo D̄co |
| 13. | Dial 3rd Digit | Br D̄ M̄ Nco Mlo D̄co | Pds | Sds | Po3 | 13 | Br D̄ M̄ Nco Mlo D̄co |
| 14. | Connection Complete | Br D̄ M̄ Nco Mlo D̄co | | | Sd5φ6 C₁ | 14 | Br D̄ M̄ Nco Mlo D̄co |
| 15. | Trunk of Tie-Line Conn. | Br D̄ M̄ Nco Mlo D̄co | Mco Mlo Dcoφ3C₁ | Stp | Stpφ5 C₁ | 15 | Br D̄ M̄ Nco Mlo D̄co |
| 16. | Dial 1st Digit Outside | Br D̄ M̄ Nco Mlo D̄co | | | D̄ Pol | 12 | Br D̄ M̄ Nco Mlo D̄co |
| 17. | Dial Outside Complete | Br D̄ M̄ Nco Mlo D̄co | | | D̄ Mco M̄lo φ1 C₁ | 16 | Br D̄ M̄ Nco Mlo D̄co |
| 18. | Place Party on Hold | Br D̄ M Nco Mlo D̄co | M M̄lo D̄co Pbh | Shi | M Mco Dco Pbm | 18 | Br D̄ M Nco Mlo D̄co |
| 19. | Placed on Hold | Br D̄ M̄ Nco Mlo D̄co | | | M M̄lo D̄co φ4 C₁ | 19 | Br D̄ M̄ Nco Mlo D̄co |
| 20. | Release Party from Hold | Br D̄ M̄ Nco Mlo D̄co | Pbh | Shr | Pbt | 20 | Br D̄ M̄ Nco Mlo D̄co |
| 21. | Released from Hold | Br D̄ M̄ Nco Mlo D̄co | | | Br M Mco Mloφ5C₁ | 21 | Br D̄ M̄ Nco Mlo D̄co |
| 22. | Transfer Pty A to Pty B | Br D̄ M Nco Mlo D̄co | Pbt | St | Pbt | 22 | Br D̄ M Nco Mlo D̄co |
| 23. | Transfer Pty A | Br D̄ M̄ Nco Mlo D̄co | Mco M̄lo D̄co φ3C₁ | Stp | D̄co M Mco Mloφ3C₁ | 23 | Br D̄ M̄ Nco Mlo D̄co |
| 24. | Transfer Pty B | Br D̄ M̄ Nco Mlo D̄co | Br M̄ Nco M̄lo φ6C₁ | Stp | Br M̄ Nco M̄lo φ2C₁ | 24 | Br D̄ M̄ Nco Mlo D̄co |
| 25. | Place Pty on Conf. | Br D̄ M Nco Mlo D̄co | M Pbc | Sc | Pb1 | 25 | Br D̄ M Nco Mlo D̄co |
| 26. | Placed on Conf. | Br D̄ M̄ Nco Mlo D̄co | | | M M̄lo D̄co φ2 C₁ | 26 | Br D̄ M̄ Nco Mlo D̄co |
| 27. | Conf. Conv. | Br D̄ M Nco Mlo D̄co | | | | | Br D̄ M Nco Mlo D̄co |
| 28. | Release Conf. Button | Br D̄ M Nco Mlo D̄co | | | Pbc | 28 | Br D̄ M Nco Mlo D̄co |
| 29. | Request Return Call | Br D̄ M̄ Nco Mlo D̄co | Mco L̄pc Brc Prbd | Src | Mco Lpc Bpc Prbd | 29 | Br D̄ M̄ Nco Mlo D̄co |
| 30. | Interrogate Call Log Mem. | Br D̄ M̄ Mco Lpc | Prpc | Spl | Pbr1 | 30 | Br D̄ M̄ Nco Mlo D̄co |
| 31. | Press Conf. Button w/o Pty | Br D̄ M̄ Nco M̄lo D̄co | M Pbc | Sec | Pb1 | 25 | Br D̄ M̄ Nco Mlo D̄co |

Patent No. 4,020,289

TABLE 2
SYNCHRONOUS INTERVAL OPERATION

| Sync. Interval | Int. Start | Int. Stop | φ0 A | φ0 BCD | φ1 A | φ1 BCD | φ2 A | φ2 BCD | φ3 A | φ3 BCD | φ4 A | φ4 BCD | φ5 A | φ5 BCD | φ6 A | φ6 BCD | φ7 A | φ7 BCD |
|---|---|---|---|---|---|---|---|---|---|---|---|---|---|---|---|---|---|---|
| Sic  | I  | φ7 |     |       |     |     |     |     |     |       |     |     |     |       | $TC_1$ |        |     |     |
| Sred | Rp | φ7 | $TC_1$ |    |     |     |     |     |     |       |     |     |     |       |     |        |     |     |
| SD3  | I  | φ7 |     | T No. | $TC_1$ |  |     |     |     |       |     |     |     |       |     |        |     |     |
| Stp  | I  | φ7 |     |       | $TC_1$ | V/A |  |     |     | R No. |     |     |     |       | $TC_1$ | T No. |     |     |
| SHI  | Rp | φ7 |     |       | $TC_1$ |     |     |     |     |       | $TC_1$ | V/A |  |       |     |        |     |     |
| SHR  | Rp | φ7 |     |       |     |     |     |     | $TC_1$ | TA No. |  |     |     |       |     |        |     |     |
| Sr   | Rp | φ7 |     |       |     |     | $TC_1$ |  |     |       |     |     | $TC_1$ |     |     |        |     |     |
| Str  | I  | φ7 |     |       |     |     |     |     |     |       |     |     |     |       |     |        | A   | BCD |
| Sc   | Rp | φ7 |     |       |     | V/A | $TC_1$ |  |     |       |     |     |     |       |     |        |     |     |
| SPC  | Rp | φ7 |     |       | $TC_1$ |  |     | RC/V |  |       |     |     | $TC_1$ | T No. | $TC_1$ | R No. |  |     |
| Sp1  | Rp | φ7 |     |       |     |     |     | RC/V |  |       |     |     | $TC_1$ | T No. |     | TA No. |  |     |
| Sc1  | Rp | φ7 |     |       | $TC_1$ |  |     |     |     |       |     |     |     | R No. |     |        |     |     |
| SRN  | I  | φ7 |     |       |     |     |     |     |     |       |     |     |     |       |     |        |     |     |

Patent No. 4,020,289

TABLE 3
ASYNCHRONOUS OPERATION

| Async. Oper. | Clear Vinc | Clear Dial | Dial On | Dial Off | Mic. On | Mic. Off | Ear. On | Ear. Off | Ring On | Ring Off | Busy On | Busy Off | Mco On | Mco Off |
|---|---|---|---|---|---|---|---|---|---|---|---|---|---|---|
| 2  | I |  |  |  |  |  |  |  |  |  |  |  |  |  |
| 4  | ø7 |  |  |  |  | I |  | I |  |  |  | I | ø5 | ø7 |
| 5  | ø7 |  |  |  |  | I | I |  |  |  |  |  |  |  |
| 7  | I | I |  | ø7 |  | I | I | I |  | I |  | I |  | ø7 |
| 11 |  |  |  | ø7 |  |  |  |  |  |  |  |  |  |  |
| 12 |  |  |  |  | I |  |  |  |  |  |  |  |  |  |
| 13 |  |  |  |  | I |  |  |  |  |  |  |  | ø5 |  |
| 14 |  |  |  |  |  |  |  |  |  |  | I |  |  |  |
| 15 | I |  | ø7 |  |  | ø7 |  |  |  |  |  | ø7 | ø5 | I |
| 16 |  |  | ø7 | I |  | I | I |  |  |  |  |  |  |  |
| 18 | ø7 | ø7 |  |  |  | I |  |  |  |  |  | I | I | ø7 |
| 19 |  |  |  |  |  | I |  |  |  |  |  |  | I | I |
| 20 |  |  |  | I | ø7 | I |  |  |  |  |  |  |  |  |
| 21 |  |  | ø7 |  | I |  |  |  |  |  |  |  |  |  |
| 22 | ø7 | ø7 | ø7 |  | ø7 |  |  |  |  |  |  |  | ø5 | ø7 |
| 23 | I |  |  |  | ø7 |  |  |  |  |  |  |  | ø7 | I |
| 24 | I | I |  |  |  |  |  |  |  |  |  |  |  |  |
| 25 |  |  |  | I |  |  |  |  |  |  |  | I |  | ø7 |
| 26 |  |  |  |  |  |  |  |  |  |  |  |  |  |  |
| 28 | I |  |  | I |  | I |  | I |  |  |  |  |  |  |
| 29 | ø7 |  |  |  |  | I |  |  |  |  |  |  | ø4 | ø7 |
| 30 | I, ø7 |  |  |  |  |  |  |  |  |  |  |  | ø4 | ø7 |
| 32 | I |  |  |  |  |  |  |  |  |  |  |  |  | ø7 |

Patent No. 4,020,289

TABLE 3 (continued)
ASYNCHRONOUS OPERATION

| Async. Oper. | Bl & Mco On | Bl & Mco Off | Dco On | Dco Off | Bm On | Bm Off | Loc On | Loc Off | Dt On | Dt Off | Lt On | Lt Off |
|---|---|---|---|---|---|---|---|---|---|---|---|---|
| 2 | | | | | | | | | | | | |
| 4 | | φ7 | | | | | | | | | | |
| 5 | | φ7 | | | | | | | | | | |
| 7 | | | | | | | | | | | | |
| 11 | | | | | | | | | | I | | |
| 12 | | | | | | | | | I | | | |
| 13 | | | | | | | | | | | | |
| 14 | | | | | | | | | | | | |
| 15 | | | | | | | | | φ7 | | | |
| 16 | | | | | | | | | φ7 | | | |
| 18 | | | | | I | | | | | | | |
| 19 | | | | | | | | | | I | | |
| 20 | | | | | | φ7 | | | | | | |
| 21 | | | | | | | | | φ7 | | | |
| 22 | | | | | | | | | φ7 | | | |
| 23 | | | | | | | | | | | | |
| 24 | | | | | | | | | | I | | |
| 25 | φ7 | | | | | | | | | | | |
| 26 | | | I | | | | | | | | | |
| 28 | | | I | | | | | | | I | | |
| 29 | | | φ7 | | | | | | | | | |
| 30 | | | | | | | | | | | 0 | φ7 |
| 32 | | | | | | | | | φ7 | | | |

LEGEND FOR TABLES 1 THROUGH 3

| | |
|---|---|
| Br, B̄r: | Receiver Button, up-down |
| BH: | Hold button |
| BRC: | Return call button |
| C.: | Code no. 1 |
| D, D̄: | Dial enable, disable |
| Dco, D̄co: | Carrier osc. to demodulator, not to demodulator |
| DT: | Dial tone |
| Lpc: | P.C. button |
| LT: | Transfer button |
| M, M̄: | Microphone, ON-OFF |
| Mco, M̄co: | Carrier osc. to modulator, not to modulator |
| MLO, M̄LO: | Local osc. to modulator, not to modulator |
| PBH: | Hold button pulse |
| PBT: | Transfer button pulse |
| PD1: | 1st digit dial pulse |
| PD3: | 3rd digit dial pulse |
| PRBD: | Receiver button-down pulse |
| PRBU: | Receiver button up-pulse |
| T#: | Transmit phone number |
| TA#: | Transmit aux. register contents |
| V/A: | Exchange contents of VMC and Aux. register |